(12) United States Patent
Chen

(10) Patent No.: US 9,373,378 B1
(45) Date of Patent: Jun. 21, 2016

(54) SEMICONDUCTOR DEVICE FOR DRIVING SUB WORD LINES

(71) Applicant: Elite Semiconductor Memory Technology Inc., Hsinchu (TW)

(72) Inventor: Yi-Fan Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 14/669,092

(22) Filed: Mar. 26, 2015

(51) Int. Cl.
*G11C 8/08* (2006.01)
*G11C 8/18* (2006.01)
*G11C 11/4074* (2006.01)

(52) U.S. Cl.
CPC .. *G11C 8/08* (2013.01); *G11C 8/18* (2013.01); *G11C 11/4074* (2013.01)

(58) Field of Classification Search
CPC .............. G11C 8/00; G11C 8/08; G11C 8/18
See application file for complete search history.

(56) References Cited

U.S. PATENT DOCUMENTS

| | | | | |
|---|---|---|---|---|
| 6,067,257 A | * | 5/2000 | Kitsukawa | G11C 11/4074 365/189.09 |
| 6,545,923 B2 | | 4/2003 | Sim et al. | |
| 6,985,399 B2 | | 1/2006 | Lee | |
| 2008/0031060 A1 | * | 2/2008 | Choi | G11C 11/4074 365/189.11 |

* cited by examiner

*Primary Examiner* — Richard Elms
*Assistant Examiner* — Ajay Ojha
(74) *Attorney, Agent, or Firm* — Juan Carlos A Marquez; Marquez IP Law Office, PLLC

(57) ABSTRACT

The semiconductor device incorporates a selected sub word line driver and a first voltage switching circuit. The selected sub word line driver has an input node connected to a selected main word line, an output node connected to a selected sub word line, a reference node supplied with a common reference voltage, and a power node. The first voltage switching circuit selectively supplies a first power voltage, a second power voltage, or the common reference voltage to the power node of the selected sub word line driver. In an active mode, the first voltage switching circuit supplies the first power voltage to pull the selected sub word line to a logic high level. In a precharge mode, the first voltage switching circuit supplies the common reference voltage and then supplies the second power voltage, thereby pulling the selected sub word line to a logic low level. A voltage level of the second power supply node is lower than a voltage level of the first power voltage and higher than the common reference voltage.

10 Claims, 9 Drawing Sheets

SEMICONDUCTOR DEVICE FOR DRIVING SUB WORD LINES

BACKGROUND OF THE INVENTION

1. Field of the Invention

The present invention relates generally to a semiconductor device that includes sub word line drivers.

2. Description of the Related Art

FIG. 1 is a schematic diagram of a conventional word line driver. The word line driver 100 comprises a main word line driver 10, and eight sub-word line drivers 12 to 14. Each of the sub-word line drivers 12 to 14 comprises a PMOS transistor P1 and a NMOS transistor N1.

The sub-word line drivers 12 to 14 are controlled by one main word line MWL. When a memory operates in an active mode, the main word line MWL is selected as a logic low level, and the source of the PMOS transistor P1 is supplied with a boosting voltage VH. Therefore, the PMOS transistor P1 is turned on and the NMOS transistor N1 is turned off, which pulls the sub word line SWL up to a logic high level (a VH level).

When the memory operates in a precharge mode, the main word line MWL is not selected as a logic high level, and the source of the PMOS transistor P1 is supplied with a ground voltage GND. Therefore, the PMOS transistor P1 is turned off and the NMOS transistor N1 is turned on, which pulls the sub word line SWL down to a logic low level. In this condition, the PMOS transistor P1 experiences a relatively significant gate-to-source voltage, and a gate-induced diode leakage (GIDL) current is generated in this period. Although the GIDL current is not serious at the time of general operation, it is not negligible in the operation mode (e.g., a precharge mode or a standby mode) in which low power consumption is required.

SUMMARY OF THE INVENTION

One aspect of the present invention is to provide a semiconductor device that includes sub word line drivers.

According to one embodiment of the present invention, the semiconductor device comprises a selected sub word line driver and a first voltage switching circuit. The selected sub word line driver has an input node connected to a selected main word line, an output node connected to a selected sub word line, a reference node supplied with a common reference voltage, and a power node. The first voltage switching circuit is configured to selectively supply one of a first power voltage, a second power voltage, and the common reference voltage to the power node of the selected sub word line driver. In an active mode, the first voltage switching circuit supplies the first power voltage to the power node of the selected sub word line driver to pull the selected sub word line to a logic high level. In a precharge mode, the first voltage switching circuit supplies the common reference voltage to the power node of the selected sub word line driver and then supplies the second power voltage to the power node of the selected sub word line driver, thereby pulling the selected sub word line to a logic low level. A voltage level of the second power supply node is lower than a voltage level of the first power voltage and higher than a voltage level of the common reference voltage.

BRIEF DESCRIPTION OF THE DRAWINGS

The invention will be described according to the appended drawings in which.

DETAILED DESCRIPTION OF THE INVENTION

Figure 1:
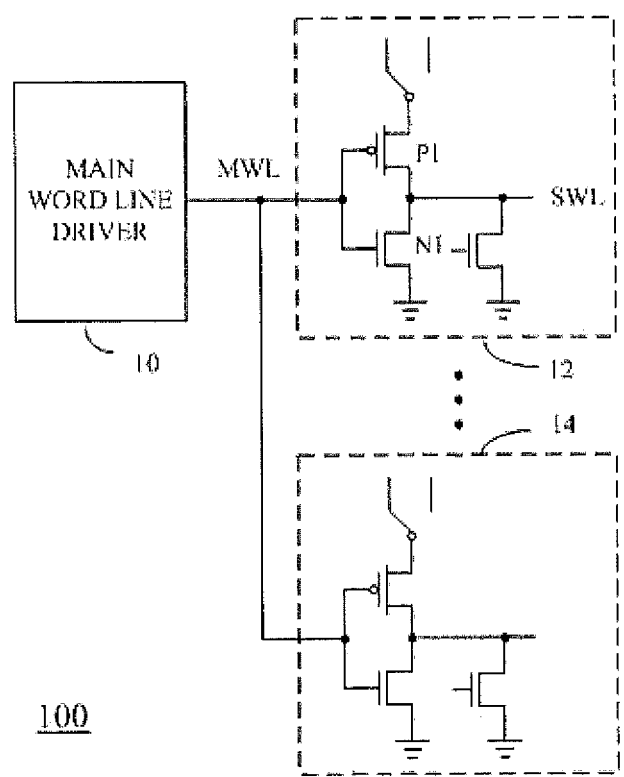
FIG. 1 is a schematic diagram of a conventional word line driver.
Figure 2:
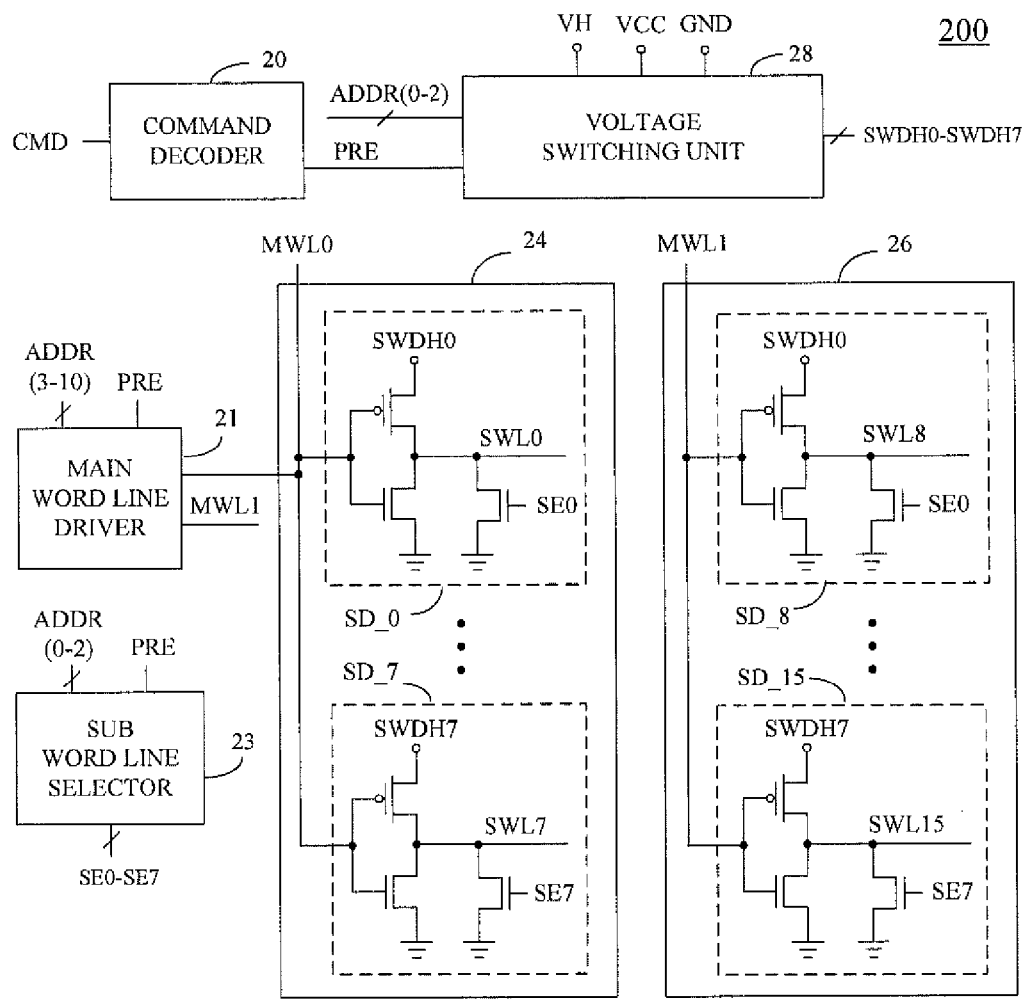
FIG. 2 shows a block diagram of a semiconductor memory device having a sub word line driver according to one embodiment of the present invention.

FIG. 2 shows a block diagram of a semiconductor memory device having a sub word line driver according to one embodiment of the present invention. Referring to FIG. 2, the word line driver 200 comprises a command decoder 20, a main word line driver 21, a sub word line selector 23, two or more sets of sub word line drivers, such as a first set of sub word line drivers 24 and a second set of sub word line drivers 26, and a voltage switching unit 28.

Referring to FIG. 2, the command decoder 20 serves to decode a command signal CMD and generate various output signals based on a decoding result. For example, when the command signal CMD indicates an active command, the command decoder 20 generates an active signal ACT; when the command signal CMD indicates a precharge command, the command decoder 20 generates a precharge signal PRE.

The main word line driver 21 serves to drive 128 main word lines including MWL0 and MWL1 in response to eight upper row address signals ADDR(3-10) in an active mode. Referring to FIG. 2, the main word line MWL0 corresponds to eight sub word lines SWL0 to SWL7 connected to memory cells (not shown), and the main word line MWL1 corresponds to eight sub word lines SWL8 to SWL15 connected to memory cells (not shown).

Referring to FIG. 2, the first set of sub word line drivers 24 comprises eight sub word line drivers SD_0 to SD_7. The sub word line driver SD_0 has an input node connected to the main word line MWL0, an output node connected to a sub-word line SWL0, a reference node supplied with a ground voltage GND and a power node configured to receive a supply voltage SWDH0 generated from the voltage switching unit 28. Other sub word lines drivers SD_1 to SD_7 have the similar configuration as the sub word line driver SD_0.

Referring to FIG. 2, the second set of sub word line drivers 26 comprises eight sub word line drivers SD_8 to SD_15. The sub word line driver SD_8 has an input node connected to the main word line MWL1, an output node connected to a subword line SWL8, a reference node supplied with the ground voltage GND and a power node configured to receive the supply voltage SWDH0 generated from the voltage switching unit 28. Other sub word lines drivers SD_9 to SD_15 have the similar configuration as the sub word line driver SD_8.

Figure 3:
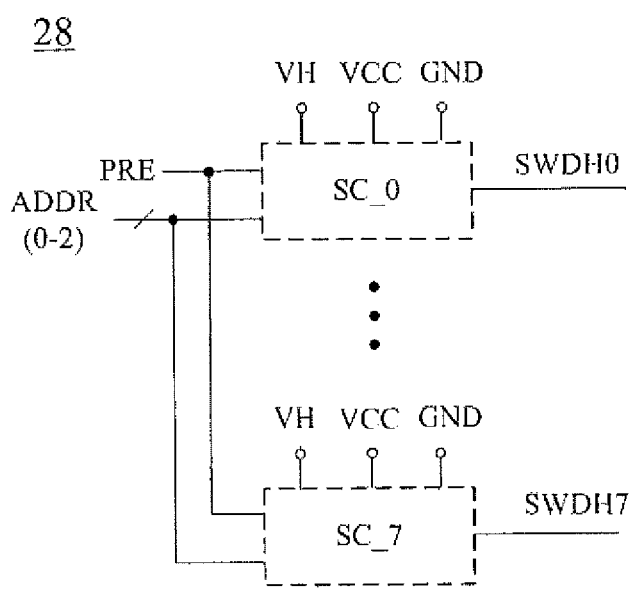
FIG. 3 shows a block diagram of the voltage switching unit according to one embodiment of the present invention.

FIG. 3 shows a block diagram of the voltage switching unit 28 according to one embodiment of the present invention. Referring to FIG. 3, the voltage switching unit 28 comprises voltage switching circuits SC_0 to SC_7 for receiving the precharge signal PRE and the three lower row address signals ADDR(0-2). Referring both to FIG. 2 and FIG. 3, the circuit SC_0 serves to provide the output voltage SWDH0 to the sub word line driver SD_0 of the first set of sub word line drivers 24 and the sub word line driver SD_8 of the second set of sub word line drivers 26 of FIG. 2, and the circuit SC_7 serves to provide an output voltage SWDH7 to the sub word line driver SD_7 of the first set of sub word line drivers 24 and the sub word line driver SD_15 of the second set of sub word line drivers 26 of FIG. 2. The circuit_0 to circuit_7 have similar circuit construction.

Figure 4:
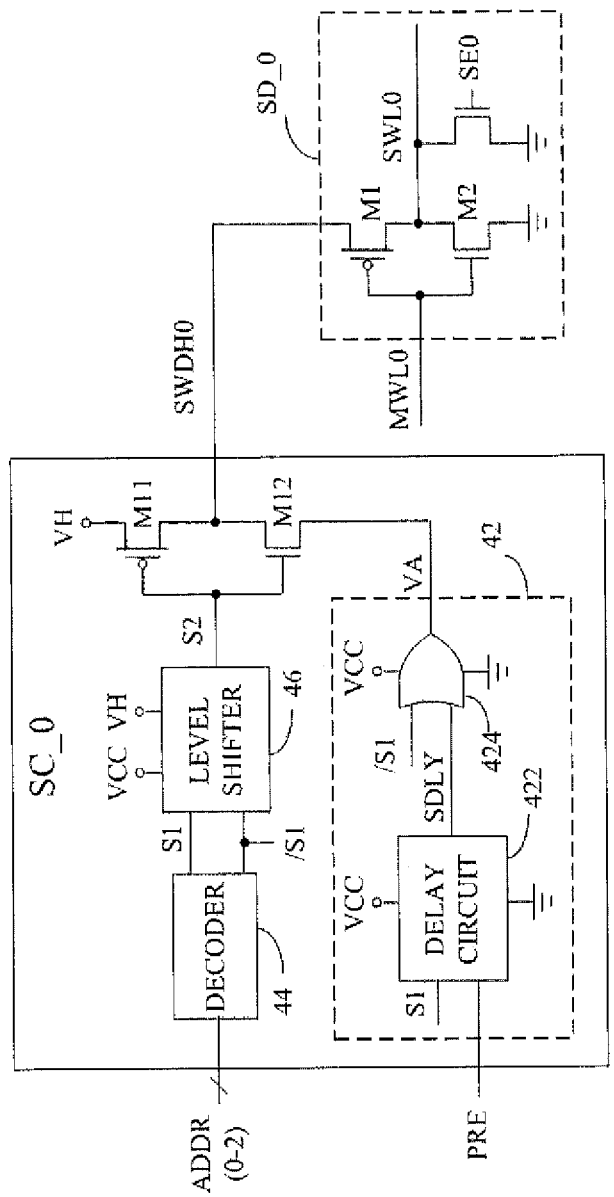
FIG. 4 shows a detailed diagram of the sub word lines driver in FIG. 2 and the voltage switching circuit shown in FIG. 3.

FIG. 4 shows a detailed diagram of the circuit SC_0 shown in FIG. 3. Referring to FIG. 4, the circuit SC_0 comprises a source voltage generator 42, a decoder 44, a level shifter 46, a PMOS transistor M11, and a NMOS transistor M12. The decoder 44 serves to generate a signal S1 by decoding the row address signals ADDR(0-2). The level shifter 46 serves to receive a low voltage input S1 and provide a high voltage output S2. The source voltage generator 42 serves to generate a bias voltage VA applied to the NMOS transistor M12.

Referring to FIG. 4, the source voltage generator 42 comprises a delay circuit 422 and an OR gate 424. The delay circuit 422 serves to receive the precharge signal PRE and delay the precharge signal PRE by a time interval. The OR gate 424 serves to receive a delay signal SDLY from the circuit 42 and an input signal /S1, which is the inverted signal S1, to generate an output signal as the bias voltage VA applied to the NMOS transistor M12.

Referring back to FIG. 2, the sub word lines SWL0 to SWL15 are driven by sub word line drivers SD_0 to SD_15, respectively. Each of the sub word line drivers SD_0 to SD_15 is controlled by an output signal from one of the main word lines MWL0 and MWL1 and one of the sub word line enable signals SE0 to SE7 from the sub word line selector 23. In one embodiment of the present invention, during the active mode, the main word line driver 21 selects the main word line MWL0 to be activated in response to the upper row address signals ADDR(3-10) and the sub word line selector 23 selects the sub word line SWL0 to be activated in response to the lower row address signals ADDR(0-2). Operations of the sub word line driver SD_0 in such case are illustrated with respect to the timing diagram of FIG. 5 and the circuit schematic of FIG. 2 and FIG. 4.

Referring to FIG. 4, at time t0, the memory device operates in the active mode. Therefore, the precharge signal PRE is deactivated at a logic low level. The decoder 44 generates the signal S1 with a logic low level, and the level shifter generates the drive signal S2 as the ground voltage GND. Therefore, the NMOS transistor M12 turns off and the PMOS transistor M11 turns on. In this manner, the circuit SC_0 supplies the power voltage VH to the sub word line driver SD_0 to pull the selected subword line SWL0 to a logic high level.

Figure 5:
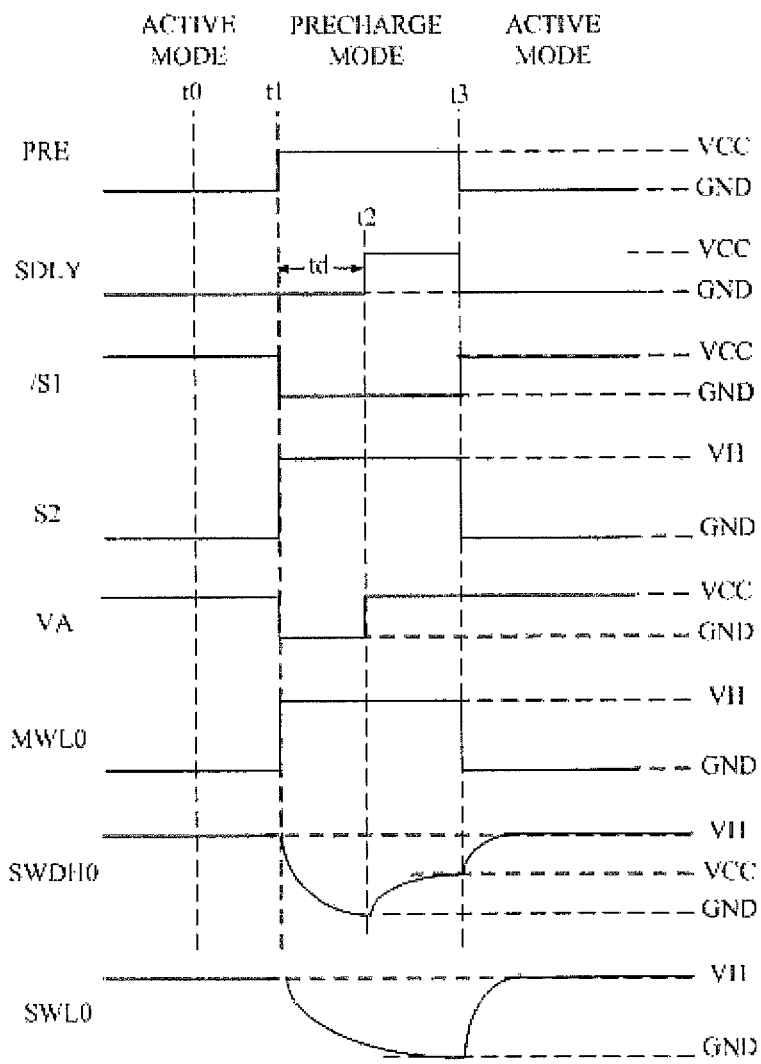
FIG. 5 is a timing diagram showing the operation of the sub word lines driver in FIG. 2 and the voltage switching circuit shown in FIG. 4.

As shown in FIG. 5, at time t1, the memory enters a precharge mode, so that all of the main word lines are not selected as a logic high level. The precharge signal PRE is activated at a logic high level. After receiving the precharge signal PRE from the command decoder 20 of FIG. 2, the delay circuit 422 of FIG. 4 delays the signal PRE by a time interval td. In one embodiment, the time interval td may be a bank precharge to bank active time interval (tRP). After the time delay td, the delay signal SDLY is transited to a logic high level. Therefore, the bias voltage VA generated from the source voltage generator 42 is quickly transited from the ground voltage GND to the power voltage VCC.

Referring to FIG. 4 and FIG. 5, during the precharge mode, the level shifter 46 outputs the drive signal S2 as the power voltage VH, which turns NMOS transistor M12 on and turns PMOS transistor M11 off so that the circuit SC_0 supplies the bias voltage VA to the sub word line driver SD_0. By varying the voltage level of the bias voltage VA applied to the transistor M12, the circuit SC_0 supplies the ground voltage GND as a drive voltage to the sub word line driver SD_0 before time t2, and then supplies the power voltage VCC as a drive voltage to the sub word line driver SD0 after time t2.

In this embodiment, the power voltage VCC is lower than the power voltage VH and higher than the ground voltage GND. As mentioned above, when the memory enters the precharge mode, the circuit SC_0 supplies the lower drive voltage to the sub word line driver SD_0 and then supplies the higher drive voltage to the sub word line driver SD_0, thereby increasing the falling speed of the sub word line SWL0. After time t2, the circuit SC_0 maintains the supply voltage at the power voltage VCC at the node SWDH0. In this manner, since the PMOS transistor M1 of the driver SD_0 is turned off in the precharge mode, a GIDL current can be reduced.

FIG. 4 and FIG. 5 show a case where the main word line MWL0 and the sub word line SWL0 are selected to be activated in the active mode. Referring now to FIG. 2, with regard to the sub word line driver SD_7 the main word line MWL0 is selected to be activated, while the sub word line SWL7 is unselected in the active mode. In this condition, the circuit SC_7 of the voltage switching unit 28 of FIG. 3 provides an output voltage SWDH7 to the sub word line driver SD_7. Operations of the word line drive are illustrated with respect to the timing diagram of FIG. 7 and the circuit schematic of FIG. 2 and FIG. 6.

At time t0, the memory device operates in an active mode. Therefore, the precharge signal PRE is deactivated at a logic low level. The decoder 44' generates a signal S1' with a logic high level by decoding the row address signals ADDR, which turns NMOS transistor M12' on and turns PMOS transistor M11' off so that the circuit SC_7 supplies a bias voltage VA' to the sub word line driver SD_7. During the active mode, the source voltage generator 42 generates the bias voltage VA' at the ground voltage GND. Therefore, the circuit SC_7 supplies the ground voltage GND to the sub word line driver SD_7 during the active mode.

At time t1, the memory enters a precharge mode, so that all of the main word lines are not selected as a logic high level. The precharge signal PRE is activated at a logic high level. After receiving the precharge signal PRE from the command decoder 20 of FIG. 2, the delay circuit 422' of FIG. 4 delays the signal PRE by a time interval td. After the time delay td, the delay signal SDLY' is transited from a logic low level to a logic high level. Therefore, the bias voltage VA' of the source voltage generator 42' is quickly transited from the ground voltage GND to the power voltage VCC.

In addition, during the precharge mode, the sub word line selector 23 of FIG. 2 outputs the sub word line enable signals SE0 to SE7 at a logic high level, which pulls the corresponding sub word lines down to the ground voltage GND. When the memory enters the active mode from the precharge mode, the sub word line enable signals SE1 to SE7 maintain at the logic high level, while the sub word line enable signal SE0 is pulled down to the ground voltage GND before the sub word line SWL0 is activated.

Figure 6:
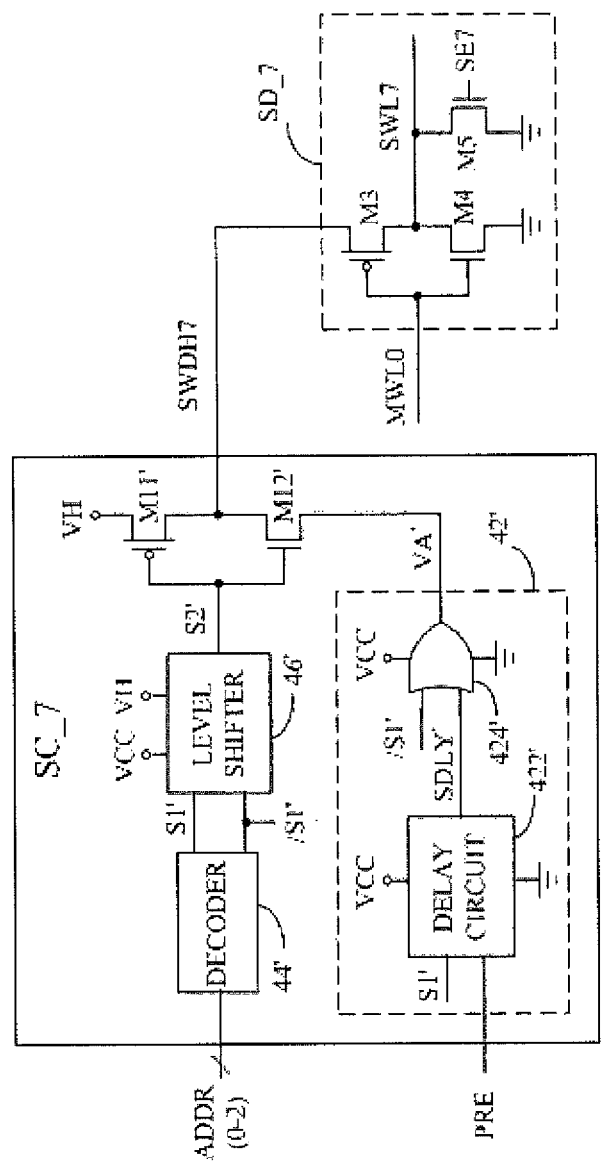
FIG. 6 shows a detailed diagram of the sub word lines driver in FIG. 2 and the voltage switching circuit shown in FIG. 3.
Figure 7:
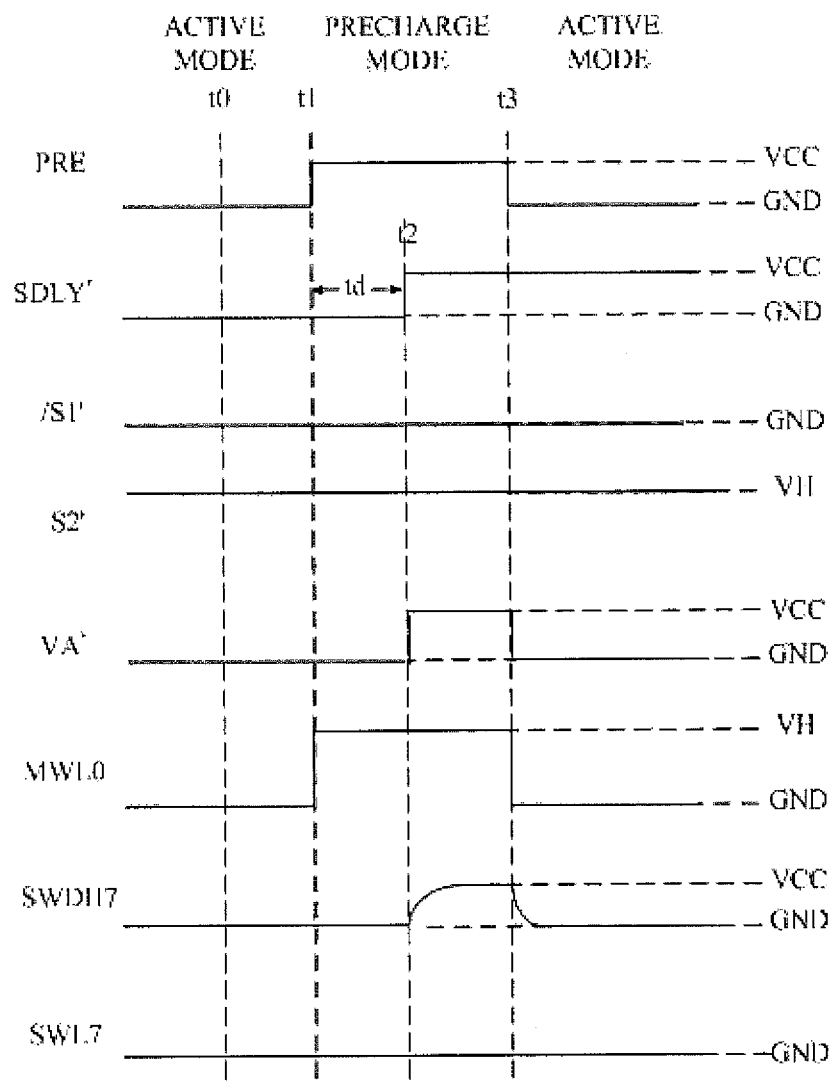
FIG. 7 is a timing diagram showing the operation of the sub word lines driver in FIG. 2 and the voltage switching circuit shown in FIG. 6.

Referring to FIG. 6 and FIG. 7, during the precharge mode, the level shifter 46' outputs the drive signal S2' at a logic high level, which turns NMOS transistor M12' on and turns PMOS transistor M11' off so that the circuit SC_7 supplies the bias voltage VA' to the sub word line driver SD_7. The voltage level of the bias voltage VA' maintains at the power voltage VCC after time t2. Therefore, a GIDL current flowing through the transistor M3 in the precharge mode can be reduced.

As described above, FIG. 4 to FIG. 7 show cases where the main word line MWL0 is selected in the active mode. Referring now to FIG. 2, in another embodiment of the present invention, the main word line MWL1 is unselected in response to the upper row address signals ADDR(3-10). Since the voltage switching unit 28 supplied power to the sub word line driver in response to the lower row address signals ADDR(0-2), rather than the upper row address signals ADDR(3-10), the supply voltage SWDH0 of the sub word line driver SD_8 is the supply voltage SWDH0 of the sub word line driver SD_0, and the supply voltage SWDH7 of the sub word line driver SD_15 is the supply voltage SWDH7 of the sub word line driver SD_7.

Figure 8:
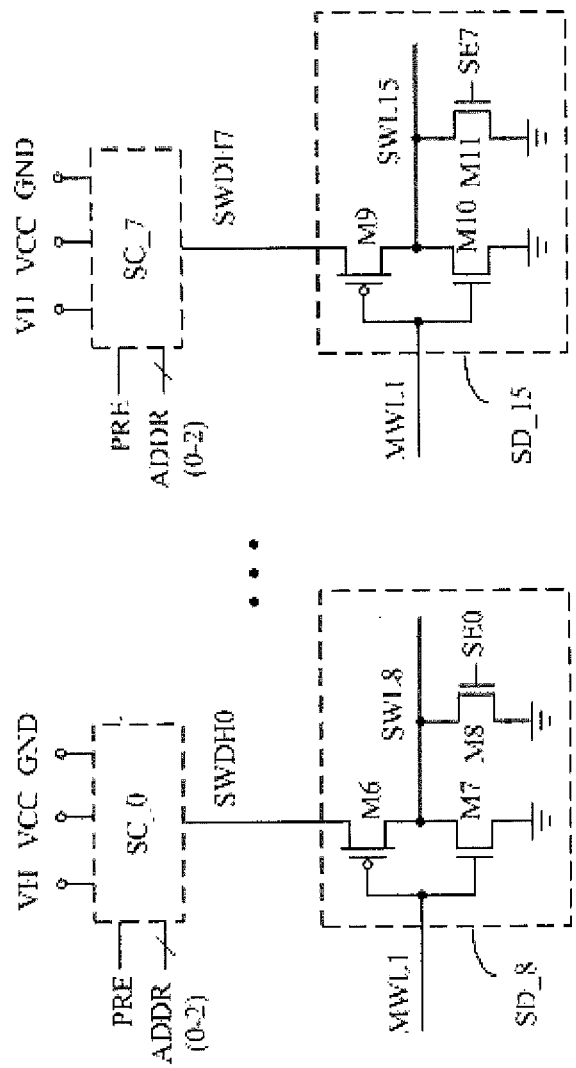
FIG. 8 shows a detailed diagram of the sub word lines driver in FIG. 2 and the voltage switching circuit shown in FIG. 3.
Figure 9:
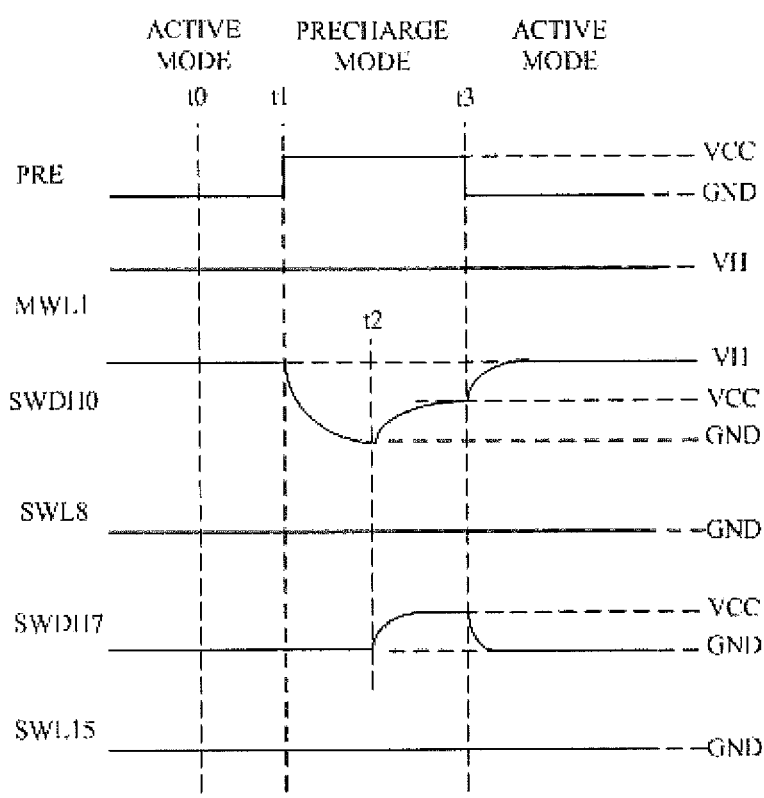
FIG. 9 is a timing diagram showing the operation of the sub word lines driver in FIG. 2 and the voltage switching circuit shown in FIG. 8.

FIG. 8 shows a detailed diagram of the sub word lines drivers SD_8 to SD_15 shown in FIG. 2. The sub word lines drivers SD_8 to SD_15 receive the supply voltage SWDH0 to SWDH7, respectively, from the voltage switching unit 28. FIG. 9 is a timing diagram showing the operation of the sub word lines driver SD_8 to SD_15 and the voltage switching circuit SC_0 and SC_7 shown in FIG. 8. The main word line MWL1 in FIG. 8 and FIG. 9 is unselected.

Referring to FIG. 8 and FIG. 9, with regard to the PMOS transistor M6 of the sub word lines driver SD_8, its source is biased with the power voltage VCC and its gate is biased with the power voltage VH during time t2 to time t3. Therefore a GIDL current of the transistor M6 can be reduced in this period. With regard to the PMOS transistor M9 of the sub word lines driver SD_15, its source is biased with the power voltage VCC and its gate is biased with the power voltage VH during time t2 to time t3. Therefore a GIDL current of the transistor M9 can be reduced in this period.

The above-described embodiments of the present invention are intended to be illustrative only. Numerous alternative embodiments may be devised by those skilled in the art without departing from the spirit and scope of the invention as recited in the following claims.

What is claimed is:

1. A semiconductor device, comprising:
    a selected sub word line driver having an input node connected to a selected main word line, an output node connected to a selected sub word line, a reference node supplied with a common reference voltage, and a power node;
    a first voltage switching circuit configured to selectively supply one of a first power voltage, a second power voltage, and the common reference voltage to the power node of the selected sub word line driver;
    wherein, in an active mode, the first voltage switching circuit supplies the first power voltage to the power node of the selected sub word line driver to pull the selected sub word line to a logic high level;
    wherein, in a precharge mode, the first voltage switching circuit supplies the common reference voltage to the power node of the selected sub word line driver and then supplies the second power voltage to the power node of the selected sub word line driver, thereby pulling the selected sub word line to a logic low level; and
    wherein a voltage level of the second power supply node is lower than a voltage level of the first power voltage and higher than a voltage level of the common reference voltage.

2. The semiconductor device of claim 1, wherein the selected sub word line driver comprises:
    a PMOS transistor configured to couple the power node to the selected sub word line during the active mode; and
    a NMOS transistor configured to couple the selected sub word line to the common reference voltage during the precharge mode.

3. The semiconductor device of claim 1, further comprising:
    a first deselected sub word line driver having an input node connected to the selected main word line, an output node connected to a first deselected sub word line, a reference node supplied with the common reference voltage and a power node;
    a second voltage switching circuit configured to selectively supply one of the first power voltage, the second power voltage, and the common reference voltage to the power node of the first deselected sub word line driver;
    wherein, in the active mode, the second voltage switching circuit supplies the common reference voltage to the power node of the first deselected sub word line driver; and
    wherein, in the precharge mode, the second voltage switching circuit supplies the common reference voltage to the power node of the deselected sub word line driver and then supplies the second power voltage to the power node of the deselected sub word line driver.

4. The semiconductor device of claim 3, wherein the first deselected sub word line driver comprises;
    a PMOS transistor configured to couple the power node to the first deselected sub word line during the active mode; and
    a NMOS transistor configured to couple the first deselected sub word line to the common reference voltage during the precharge mode.

5. The semiconductor device of claim 1, further comprising:
    a first deselected sub word line driver having an input node connected to a deselected main word line, an output node connected to a first sub word line, a reference node supplied with the common reference voltage and a power node; and
    wherein, in the active mode, the first voltage switching circuit supplies the first power voltage to the power node of the first deselected sub word line driver;
    wherein, in a precharge mode, the first voltage switching circuit supplies the common reference voltage to the power node of the first deselected sub word line driver and then supplies the second power voltage to the power node of the first deselected sub word line driver.

6. The semiconductor device of claim 5, wherein the first deselected sub word line driver comprises:
    a first NMOS transistor configured to couple the first sub word line to the common reference voltage during the active mode; and
    a second NMOS transistor configured to couple the first sub word line to the common reference voltage during the precharge mode.

7. The semiconductor device of claim 3, further comprising:
    a second deselected sub word line driver having an input node connected to a deselected main word line, an output node connected to a first sub word line, a reference node supplied with the common reference voltage and a power node;

wherein, in the active mode, the second voltage switching circuit supplies the common reference voltage to the power node of the second deselected sub word line driver; and wherein, in the precharge mode, the second voltage switching circuit supplies the common reference voltage to the power node of the second deselected sub word line driver and then supplies the second power voltage to the power node of the second deselected sub word line driver.

8. The semiconductor device of claim 7, wherein the second deselected sub word line driver comprises:

a first NMOS transistor configured to couple the first sub word line to the common reference voltage during the active mode; and a second NMOS transistor configured to couple the first sub word to the common reference voltage during the precharge mode.

9. The semiconductor device of claim 1, wherein the first voltage switching circuit comprises:

a delay circuit configured to delay an input signal indicative of the precharge mode by a first time interval;

a PMOS transistor configured to couple the first power voltage to the power node during the active mode; and a NMOS transistor configured to couple the common reference voltage to the power node in the first time interval during the precharge mode, and couple the second power voltage to the power node in a second time interval later than the first time interval during the precharge mode.

10. The semiconductor device of claim 3, wherein the second voltage switching circuit comprises:

a delay circuit configured to delay an input signal indicative of the precharge mode by a first time interval; and a NMOS transistor configured to couple the common reference voltage to the power node during the active mode, couple the common reference voltage to the power node in the first time interval during the precharge mode, and couple the second power voltage to the power node in a second time interval later than the first time interval during the precharge mode.

* * * * *